(12) United States Patent
Ritter (10) Patent No.: US 9,651,638 B2
(45) Date of Patent: May 16, 2017

(54) METHOD AND DEVICE FOR DETERMINING A MAGNETIC RESONANCE SYSTEM ACTIVATION SEQUENCE

(75) Inventor: Dieter Ritter, Fürth (DE)

(73) Assignee: Siemens Aktiengesellschaft, München (DE)

(*) Notice: Subject to any disclaimer, the term of this patent is extended or adjusted under 35 U.S.C. 154(b) by 753 days.

(21) Appl. No.: 13/087,272

(22) Filed: Apr. 14, 2011

(65) Prior Publication Data

US 2011/0254546 A1   Oct. 20, 2011

(30) Foreign Application Priority Data

Apr. 15, 2010  (DE) ........................ 10 2010 015 066

(51) Int. Cl.
| | |
|---|---|
| G01R 33/44 | (2006.01) |
| G01R 33/28 | (2006.01) |
| G01R 33/561 | (2006.01) |

(52) U.S. Cl.
CPC ....... G01R 33/288 (2013.01); G01R 33/5612 (2013.01)

(58) Field of Classification Search
CPC . G01R 33/288; G01R 33/5612; G01R 33/543
USPC ................................................ 324/307, 309
See application file for complete search history.

(56) References Cited

U.S. PATENT DOCUMENTS

| | | | |
|---|---|---|---|
| 2006/0017437 A1* | 1/2006 | Vu | 324/309 |
| 2008/0231270 A1* | 9/2008 | Fontius et al. | 324/307 |
| 2009/0108842 A1 | 4/2009 | Habara et al. | |
| 2009/0322329 A1* | 12/2009 | Diehl et al. | 324/309 |
| 2010/0134105 A1* | 6/2010 | Zelinski et al. | 324/309 |
| 2010/0308825 A1 | 12/2010 | Brinker et al. | |

(Continued)

FOREIGN PATENT DOCUMENTS

| | | |
|---|---|---|
| DE | 10 2006 020 398 A1 | 10/2007 |
| DE | 10 2006 058 162 B3 | 6/2008 |
| DE | 10 2009 024 077 A1 | 12/2010 |

OTHER PUBLICATIONS

Zelinski, Adam, "Improvements in Magnetic Resonance Imaging Excitation Pulse Design," Sep. 2008, MIT, pp. 217-253.*

(Continued)

*Primary Examiner* — Melissa Koval
*Assistant Examiner* — Rishi Patel
(74) *Attorney, Agent, or Firm* — Lempia Summerfield Katz LLC (57) ABSTRACT

A method and a control sequence determination device for determining a magnetic resonance system activation sequence are described. The magnetic resonance system activation sequence includes a multichannel pulse train with a plurality of individual HF pulse trains to be emitted in a parallel manner by the magnetic resonance system by way of different independent high-frequency transmit channels. In this process, a multichannel pulse train is calculated with a predefined target magnetization using an HF pulse optimization method, with optimization taking place with respect to a setpoint deviation of an HF local exposure value from an HF global exposure value. A method for operating a magnetic resonance system and a magnetic resonance system with the control sequence determination device are also described.

21 Claims, 2 Drawing Sheets

(56) References Cited

U.S. PATENT DOCUMENTS

2011/0043205 A1* 2/2011 Graesslin et al. ............ 324/307
2011/0148412 A1* 6/2011 Kanazawa .................... 324/309

OTHER PUBLICATIONS

German Office Action dated Apr. 16, 2013 for corresponding German Patent Application No. DE 10 2010 015 066.5 with English translation.
X. Wu et al., "SAR Reduction in Transmit SENSE Using Adapted Excitation k-Space Trajectories," Proc. Intl. Soc. Mag. Reson. Med., vol. 15, p. 673, 2007.
German Office Action dated Jun. 7, 2011 for corresponding German Patent Application No. DE 10 2010 015 066.5 with English translation.
Grissom, et al., "Spatial Domain Method for the Design of RF Pulses in Multicoil Parallel Excitation," Magnetic Resonance in Medicine 56 (2006): pp. 620-629.
Kawin Setsompop, et al., "High-flip-angle slice-selective parallel RF transmission with 8 channels at 7 T," Journal of Magnetic Resonance 195 (2008): pp. 76-84.
Brian A. Hargreaves, et al., "Variable-Rate Selective Excitation for Rapid MRI Sequences," Magnetic Resonance in Medicine 52 (2004): pp. 590-597.
Kawin Setsompop, "Design Algorithms for Parallel Transmission in Magnetic Resonance Imaging," Massachusetts Institute of Technology, (Jun. 2008).
Dan Xu, et al., "Designing Multichannel, Multidimensional, Arbitrary Flip Angle RF Pulses Using an Optimal Control Approach," Magnetic Resonance in Medicine 59 (2008): pp. 547-560.
Daeho Lee, et al., "Time-Optimal Design for Multidimensional and Parallel Transmit Variable-Rate Selective Excitation," Magnetic Resonance in Medicine 61(2009): pp. 1471-1479.
Yinan Liu, et al., "Minimal-SAR RF Pulse Optimization for Parallel Transmission in MRI," 30th Annual International IEEE EMBS Conference, Vancouver, British Columbia, Canada, Aug. 20-24, 2008, pp. 5774-5777.

* cited by examiner

METHOD AND DEVICE FOR DETERMINING A MAGNETIC RESONANCE SYSTEM ACTIVATION SEQUENCE

This application claims the benefit of DE 10 2010 015 066.5, filed Apr. 15, 2010.

BACKGROUND

The present embodiments relate to a method and a control sequence determination device for determining a magnetic resonance system activation sequence.

In a magnetic resonance system, the body to be examined may be exposed to a relatively high basic field magnetic field, of 3 or 7 Tesla, for example, with the aid of a basic field magnet system. A magnetic field gradient is also applied with the aid of a gradient system. High-frequency excitation signals (HF signals) are transmitted by way of a high-frequency transmit system using suitable antenna devices to tip the nuclear spin of certain atoms that have been excited in a resonant manner by the high-frequency field with spatial resolution through a defined flip angle in relation to the magnetic field lines of the basic magnetic field. The high-frequency excitation and the resulting flip angle distribution is also referred to below as nuclear magnetization or abbreviated to magnetization. During relaxation of the nuclear spin, high-frequency signals (e.g., magnetic resonance signals) are emitted. The high-frequency signals are received using suitable receive antennas and are further processed. Raw data acquired by the receive antennas may be used to reconstruct desired image data. Transmission of the high-frequency signals for nuclear spin magnetization takes place using a body coil or local coils present on the patient or participant. A structure of the body coil may be a birdcage antenna consisting of a number of transmit rods disposed around a patient chamber of the tomography system, in which a patient is present during the examination, running parallel to the longitudinal axis. End faces of the antenna rods are connected respectively in a capacitive manner in a ring.

The body antennas may be operated in a "homogeneous mode" (e.g., a "CP mode"). A single temporal HF signal is emitted to all components of the transmit antenna (e.g., all the transmit rods of the birdcage antenna). In this process, the pulses may be transferred to the individual components in a phase-shifted manner with a displacement tailored to the geometry of the transmit coil. For example, in the case of a birdcage antenna with 16 rods, the rods may each be shifted through 22.5° phase displacement with the same HF magnitude signal. The homogeneous excitation results in a global high-frequency exposure of the patient, which is limited according to rules, as too high a high-frequency exposure may harm the patient. The high-frequency exposure of the patient may be calculated beforehand when planning the high-frequency pulses to be emitted, and the high-frequency pulses are selected so that a certain limit is not reached. HF exposure in the following may be a physiological exposure induced by the HF irradiation and not the HF energy introduced. A typical measure of high-frequency exposure is a specific absorption rate (SAR) value that indicates in watts/kg the biological exposure acting on the patient due to a certain high-frequency pulse output. A standard limit of 4 watts/kg at a "first level" according to the IEC standard applies, for example, for the global SAR or HF exposure of the patient. In addition to the prior planning, the SAR exposure of the patient is also monitored continuously on the magnetic resonance system during the examination using suitable safety devices, and a measurement is changed or terminated if the SAR value is above the specified standards. The most precise prior planning may avoid interrupting a measurement, as interrupting the measurement necessitates a new measurement.

With more recent magnetic resonance systems, individual HF signals tailored for imaging purposes may be assigned to the individual transmit channels (e.g., the individual rods of the birdcage antenna). A multichannel pulse train that consists of a plurality of individual high-frequency pulse trains that may be emitted in a parallel manner by way of the different independent high-frequency transmit channels is emitted. The multichannel pulse train (e.g., a "pTX pulse" due to the parallel emission of the individual pulses) may be used, for example, as an excitation, refocusing and/or inversion pulse.

The multichannel pulse trains may be generated beforehand for a certain planned measurement. In an optimization method, the individual HF pulse trains (e.g., the HF trajectories) are determined for the individual transmit channels over time as a function of a "transmit k space gradient trajectory" that may be predefined by a measurement protocol. The "transmit k space gradient trajectory" (referred to as "k space gradient trajectory" or "gradient trajectory") refers to the places in the k space that may be started up by setting the individual gradients at certain times (e.g., by gradient pulse trains (with appropriate x, y and z gradient pulses) to be emitted in a coordinated manner as appropriate for the HF pulse trains). The k space is the spatial frequency space, and the gradient trajectory in the k space describes the path in the k space traveled in time during emission of an HF pulse or the parallel pulses by corresponding switching of the gradient pulses. By setting the gradient trajectory in the k space (e.g., by setting the appropriate gradient trajectory applied parallel to the multichannel pulse train), the spatial frequencies, at which certain HF energies are deposited, may be determined.

To plan the HF pulse sequence, a user predefines a target magnetization (e.g., a desired flip angle distribution with spatial resolution) that is used within the target function as a setpoint value. The appropriate HF pulse sequence for the individual channels is calculated in the optimization program, so that target magnetization is achieved. A method for designing the multichannel pulse trains in parallel excitation methods is described, for example, in W. Grishom et al., "Spatial Domain Method for the Design of RF Pulses in Multicoil Parallel Excitation," Mag. Res. Med. 56, pp. 620-629, 2006.

For a certain measurement, the different multichannel pulse trains, the gradient pulse trains associated with the respective activation sequence and further control defaults are defined in a measurement protocol. The measurement protocol is produced beforehand and may be called up for the measurement from a memory, for example, and optionally changed by the operator. During the measurement, the magnetic resonance system is controlled fully automatically on the basis of the measurement protocol, with the control facility of the magnetic resonance system reading commands out of the measurement protocol and processing the commands.

During the emission of the multichannel pulse trains, homogeneous excitation may be replaced with an excitation of any form in the measurement space and also in the patient. To estimate the maximum high-frequency exposure, every possible high-frequency superimposition may be examined. The high-frequency superimpositions may be examined, for example, using a patient model incorporating tissue-specific attributes such as, for example, conductivity, dielectricity and/or density in a simulation. From previous simulations, "hot spots" may form in the high-frequency field in the patient. The high-frequency exposure may be many times the values known from homogeneous excitation at the hot spots. The resulting high-frequency limitations are unacceptable when performing clinical imaging, as if the hot spots are taken into account, the overall transmit power may be too low to produce acceptable images. When planning the multichannel pulse trains, the local high-frequency exposure may not be too great, but the overall HF transmit power should not be reduced unnecessarily, thereby adversely affecting image quality.

SUMMARY AND DESCRIPTION

The present embodiments may obviate one or more of the drawbacks or limitations in the related art. For example, a method and a corresponding control sequence determination device for determining magnetic resonance system activation sequences that allow reliable controllability of local high-frequency (HF) exposure of the patient may be provided.

In one embodiment of the method for determining magnetic resonance system activation sequences, a multichannel pulse train is calculated on the basis of a predefined target magnetization using an HF pulse optimization method. According to the present embodiments, in the HF pulse optimization method, optimization takes place with respect to a setpoint deviation of an HF local exposure value from an HF global exposure value.

The HF global exposure value may be a value that may be monitored in the normal manner during a measurement with respect to compliance with a limit value (e.g., a conventional SAR value). The limit value may be, for example, the value of 4 watts/kg at a "first level," according to the IEC standard. Different methods for taking global HF exposure into account at a planning stage before a measurement and monitoring the global HF exposure during a measurement are sufficiently known to the person skilled in the art and therefore do not need to be explained further. One example of a method for taking global HF exposure into account is online monitoring with a high-frequency output control device (e.g., a radio frequency safety watch dog (RFSWD)). The HF local exposure value is a function of the activation sequence and may be defined in detail in different ways. This depends, among other things, on the optimization method used in each instance. The HF local exposure value represents local exposure at individual points in the examination object (e.g., possible hot spots) in an appropriate manner. Local HF exposure may not be the HF amplitude occurring at a place or in a certain volume unit but may be the resulting energy exposure or the physiological exposure induced by the HF irradiation (e.g., in the form of a specific energy dose (SED) value or specific absorption rate (SAR) value in a certain local volume) at one or more hot spots, for example. The HF local exposure value may be based, for example, on one or more local SAR values or SED values, depending how the HF global exposure value is defined. In one embodiment, the same measurement units are used for the HF local exposure value and the HF global exposure value. The SAR value may, however, be converted to the SED value and vice versa.

The setpoint deviation (e.g., the permitted deviation) between the HF local exposure value and the HF global exposure value may be selected in an arbitrary manner. The setpoint deviation may, for example, be a predefined difference that may also be set as equal to zero (e.g., in an attempt to tailor the HF local exposure value to the HF global exposure value). In one embodiment, the ratio between the HF local exposure value and the HF global exposure value may be optimized to a predefined value (e.g., to a predefined factor), by which the HF local exposure value may be greater than the HF global exposure value.

With the methods of the present embodiments, the multichannel pulse train and, optionally, further parameters in the context of pulse design are not minimized to a relatively undefined HF local exposure value. At the time of calculation of the HF pulses, it is not yet clear whether the sequence used would (at the desired transmit power and optionally when a multilayer recording method is used) actually exceed the local limit values at the relatively undefined HF local exposure value. With an optimization to a setpoint deviation from the HF global exposure value (e.g., a fixed ratio between the HF local exposure value and the HF global exposure value) the mechanism for predicting global HF exposure and local HF exposure is no longer different. The global HF exposure may, however, be calculated relatively easily beforehand with the method described above and may also be monitored effectively online (e.g., during raw data acquisition).

A further advantage of the methods of the present embodiments is that local exposure values are not reduced unnecessarily, as minimization of the local HF exposure is also associated automatically with a smaller HF amplitude and therefore with a lesser performance during data acquisition. The local HF exposure may be controlled more precisely, and compliance may be monitored with limit values, while also improving image quality.

In another embodiment, a control sequence determination device includes an input interface for detecting a target magnetization and an HF pulse optimization unit for using an HF pulse optimization method to calculate the multichannel pulse train on the basis of a predefined target magnetization. The control sequence determination device also includes a control sequence output interface for transferring the control sequence for activating the magnetic resonance system for data acquisition to a control device or saving the control sequence in a memory for this purpose. According to the present embodiments, the control sequence determination device is configured so that during the HF pulse optimization method, the control sequence determination device performs an optimization with respect to a setpoint deviation of an HF local exposure value from an HF global exposure value. The input interface may also serve to input a limit value for a predefined HF global exposure value and/or a predefined deviation from an HF global exposure value (e.g., a factor).

With the method for operating the magnetic resonance system of the present embodiments, an activation sequence is determined, and the magnetic resonance system is operated using the activation sequence. The magnetic resonance system of the present embodiments includes the control sequence determination device as described above.

Parts of the control sequence determination device may be configured in the form of software components. The HF pulse optimization unit and a specific HF exposure optimization unit may be configured in the form of software components, for example. The input interface may, for example, be a user interface for the manual inputting of a target magnetization (e.g., also a graphical user interface). The input interface may also be an interface for selecting and transferring data (e.g., also a definition for calculating the HF local exposure value and/or a limit value for a predefined HF global exposure value and/or a predefined deviation of the HF local exposure value from an HF global exposure value) from a data memory disposed within the control sequence determination device or connected to the control sequence determination device via a network (e.g., optionally also using the user interface). The control sequence output interface may be, for example, an interface that transfers the control sequence to a magnetic resonance controller in order to control the measurement directly or may be an interface that sends the data by way of a network and/or saves the data in a memory for later use. These interfaces may be at least partially configured in the form of software and may access hardware interfaces of an existing computer.

The present embodiments may include a computer program that may be loaded directly into a non-transitory computer-readable medium (e.g., a memory) of a control sequence determination device, the computer program having program code segments in order to execute the acts of the methods of the present embodiments, when the program is executed in the control sequence determination device. Such a software-based implementation has the advantage that former devices and/or systems used for determining control sequences (e.g., suitable computers in computer centers of the magnetic resonance system manufacturer) may be modified by implementing the program in an appropriate manner to determine control sequences that are associated with a lower level of and/or more reliably controllable high-frequency exposure.

The local HF exposure varies at different places in the body of the examination object, such that hot spots may form. At the hot spots, high levels of HF exposure (e.g., HF-induced physiological exposure) may occur.

The HF local exposure value may be formed from a combination of different local HF exposure values in different volume units with specific tissue attributes. The volume units may be individual volume elements (e.g., individual voxels) or larger volume units (e.g., voxel groups). In one embodiment, the HF local exposure value is based on an HF local exposure vector that includes the local HF exposure values. The HF local exposure vector may include a defined number of local HF exposure values at particularly exposed positions (e.g., at previously identified possible hot spots). For example, to form the HF local exposure vector, the local HF exposure values of a certain number of the most exposed hot spots (e.g., the 30 biggest hot spots) may be used. The HF local exposure value may include a predefined standard of the HF local exposure vector. Different possible standards are, for example, the maximum standard, an amount sum standard (L standard) or a Euclidian standard ($L_2$ standard).

In one embodiment, the local HF exposure value may be based on a specific energy dose of at least one volume unit (e.g., an individual voxel or a voxel group).

In another embodiment of the method for determining magnetic resonance system activation sequences, the local HF exposure value is based on a correlation (e.g., a cross correlation) of the individual HF pulse trains of the multichannel pulse train to be emitted in a parallel manner. The local HF exposure value may be based on a tissue-specific sensitivity matrix that represents the dependency of the HF exposure on a current HF transmit amplitude in the respective volume unit for different volume units of the examination object. The sensitivity matrix may, for example, include a sensitivity value for each individual voxel, which when multiplied by the amplitude of the high-frequency field, indicates the E field in the respective voxel.

In yet another embodiment, the method for determining magnetic resonance system activation sequences includes a number of method stages, with the HF local exposure value being optimized with respect to the setpoint deviation from to HF global exposure value using different methods in different method acts. The algorithmic options for optimization may be used in all the functional methods of HF pulse design. In places where the local HF exposure value is below a predefined setpoint value, parameters of relevance for HF exposure may be changed such that the local HF exposure value is increased. This allows a reduction of the local HF exposure at over-exposed places, without reducing the overall HF output. The predefined setpoint value for the local HF exposure may be derived from the setpoint deviation from the HF global exposure value. The parameters of relevance for HF exposure may be various parameters used within pulse design (e.g., a predefined gradient trajectory form, a variable sampling speed on the gradient trajectory, and/or a length over time of an HF pulse) that are relevant for the local HF exposure.

Every attempt is not made to reduce the overall HF transmit power but to distribute the HF transmit power locally and therefore to average the HF transmit power over the hot spots so that the local HF exposure reaches the desired value or the desired deviation in relation to the HF global exposure value.

An HF pulse optimization method operates with a predefined target function. In one embodiment of the method for determining magnetic resonance system activation sequences, a target function is predefined such that the target function includes at least one HF local exposure value of the examination object that is a function of the activation sequence (or the multichannel pulse train). Since the HF local exposure value is a function of the activation sequence, the HF local exposure value forms a "local exposure function term" within the target function, so that the terms "HF local exposure value" and "local exposure function term" are used synonymously below.

Various options for including the local exposure function term in the target function are described in more detail below. The HF exposure at individual spatial points is considered directly in the target function, not just in the global HF exposure. By including the HF local exposure value in the target function, the target function is a function of a deviation of the HF local exposure value from the HF global exposure value. Thus, during optimization, the local HF exposure satisfies the desired conditions. The HF local exposure value may be multiplied, for example, by a predefined deviation factor, and the difference between the value thus obtained and the predefined HF global exposure value is minimized within the target function as part of the optimization method.

The control sequence determination device may be configured to use the target function in the HF pulse optimization method, the target function including at least one local HF exposure value of the examination object that is a function of the activation sequence.

In one embodiment, the target function is selected so that in the optimization method, a predefined combination (e.g., a sum) of spatially different local HF exposure values is tailored to the setpoint deviation from the HF global exposure value. This may be achieved, for example, by using an amount sum standard or a Euclidian standard of the HF local exposure vector as the HF local exposure value in the target function. This combination of the spatially different HF exposure values (e.g., the amount sum standard or Euclidian standard of the HF local exposure vector) may be multiplied as described above by the predefined deviation factor, and the difference from the predefined HP global exposure value may be minimized as part of the optimization method.

The local exposure function term forms a local exposure equalization term. The local exposure equalization term causes the multichannel pulse train to be calculated such that critical local HF exposure values, for example, are reduced and less critical local HF exposure values are optionally increased during optimization of the target function. If, for example, for the local exposure function term, the HF exposure vector is selected from the local HF exposure values at the different hot spots, a type of "hot spot equalization term" is introduced into the target function for pTX pulse design. In this process, HF energy is extracted from one or a number of critical hot spots in the HF exposure vector, and HF energy is fed correspondingly to the other less critical hot spots.

In one embodiment of the optimization method, a maximum value of local HF exposure may be taken into account in a similar manner to incorporate the deviations of the HF local exposure value from the HF global exposure value in the target function. If the local exposure function term contains, for example, the maximum standard of the HF local exposure vector, a maximum vector element of the HF local exposure vector is automatically tailored to the HF global exposure value. This is the hot spot featuring the greatest exposure, for example. In this embodiment, only one local hot spot is taken into account, not a combination of different local HF exposure values in different volume units.

In one embodiment of the method for determining magnetic resonance system activation sequences, the k space gradient trajectory is also optimized with respect to the HF local exposure value using a parameterizable function in an HF exposure optimization method. In the prior art, the multichannel pulse trains were determined in the optimization method as a function of a fixed "k space gradient trajectory" that may be predefined by a measurement protocol. During the design of the gradient trajectory, relevant regions in the k space are also passed through. For example, if a region that is sharply defined in the spatial space (e.g., a rectangular or oval) is to be excited, an outer boundary region of the k space is also to be covered. If only a rough definition is desired, coverage in the inner k space region is sufficient. A protocol designer may therefore already have certain experience when selecting the k space trajectory, so that target magnetization may be achieved with the k space trajectory.

In the methods of the present embodiments, the measurement protocol designer may predefine a k space gradient trajectory as before but the predefined k space gradient is only considered to be an initial basic form. In other words, the gradient trajectory may be selected in the context of the predefined basic form in the optimization method such that the HF energy is distributed widely in the k space to avoid high HF peaks. The HF peaks that do occur increase the effective overall high-frequency output considerably, which dominates the SAR exposure of the patient. The methods of the present embodiments may allow the high-frequency exposure for the patient to be reduced almost by a factor of three in a simple manner while maintaining image quality.

One embodiment of the control sequence determination device is configured to optimize the k space gradient trajectory using a parameterizable function at least with respect to the HF exposure value of the examination object in an HF exposure optimization method.

Within the HF exposure optimization method, geometric parameters of the k space gradient trajectory are minimized. The geometric parameters may include parameters for determining the geometric design of echo planar imaging (EPI) trajectories and/or spoke positions and/or spiral geometries and/or radial geometries and/or free-form geometries.

For example, the gradient trajectory may be predefined as a spiral with variable parameters. The original linear enlargement of the radius of an Archimedean spiral may be set variably by a function (e.g., a 2-point spline). The variable geometric parameters may influence the spread of the spiral in the x direction and in the y direction and the distance between two adjacent tracks within the spiral.

In the case of a spoke geometry in the k space, individual points in the k space are started up one after the other by setting x and y gradients (e.g., ten points located on a number of circles). To stop a started x/y position in the k space, the x gradient and the y gradient are turned off. In other words, no more pulses are applied in the x gradient and the y gradient directions. Instead, a z gradient is turned on during emission of the high-frequency pulses to measure the relevant point in the k space in a layer-selective manner. With such a measurement method, the x and y positions of the spokes in the k space may be fixed by appropriate selection of the geometric parameters. Radial geometries include, for example, rosette geometries, and free-form geometries are freely selectable geometries.

In one embodiment, the HF exposure optimization method may be linked to the HF pulse optimization method. In other words, the HF exposure optimization method and the HF pulse optimization method are integrated with one another in some manner (e.g., by the HF exposure optimization method including the HF pulse optimization method or vice versa).

In one embodiment of the method for determining magnetic resonance system activation sequences, an iterative method is performed, in that the multichannel pulse train is determined for a defined k space gradient trajectory using the HF pulse optimization method. This may be performed, for example, with the standard HF pulse optimization method described above using a target function of the present embodiments (e.g., by tailoring the actual magnetization to a target or setpoint magnetization by varying the HF pulse trains to be emitted using a least mean square method). In a further act of the iterative method, a predicted HF exposure of the examination object is determined on the basis of the determined multichannel pulse train. In other words, the HF pulses predefined within the multichannel pulse train and the predefined gradient trajectory (or the gradient pulses defined by the predefined by the predefined gradient trajectory) are deployed in a simulation, and the HF exposure is thus calculated. In a further act, according to a predefined optimization strategy of the HF exposure optimization method, the geometric parameters of the k space gradient trajectory are varied to tailor the local HF exposure. The acts described above are repeated with the new k space gradient trajectory in further iteration steps. This continues until a termination criterion is reached (e.g., until a maximum number of iterations has been reached, or the target function to be minimized has reached the desired minimum or dropped below a predefined $\in$ value).

A variable sampling speed of the k space-gradient trajectory may be set during the emission of HF pulses such that the sampling speed is reduced at points where there is a higher expected HF voltage (e.g., in the center of the k space). The sampling speed is increased at points where the expected HF voltage is lower. This adjusts the speed of passage through the k space in order to distribute the HF energy input over time and thereby tailor the HF local exposure value more effectively to the HF global exposure value.

The pulses may be extended or compressed by setting a maximum permitted gradient rate and slew rate (rise speed of gradient pulses). The HF energy introduced may thus be distributed in an optimum manner.

In one embodiment, an adjustment involves extending the HF pulses over time at points where the expected local HF exposure value is too high and compressing the HF pulses over time at points where the expected local HF exposure value is too low. A variable rate selective excitation (VERSE) algorithm may be used for this purpose. To tailor the HF local exposure value to the setpoint deviation in relation to the HF global exposure value, not only is the local HF exposure limited, but the local SAR is also increased (in conjunction with pulse time shortening and/or setpoint magnetization improvement) if an HF exposure limit has not yet been reached.

The calculation of the multichannel pulse train in the context of the HF pulse optimization method of the present embodiments, may initially take place for a lower target magnetization. The multichannel pulse train determined in this process is scaled up to a final target magnetization and optionally corrected again. This procedure utilizes the fact that the magnetization behavior is still linear for low magnetizations (e.g., for small flip angles (in the low flip range) between 0 and 5°). A calculation using an optimization method is much simpler and more stable in the low flip range. Once the optimum multichannel pulse train has been found for the low flip range, the optimum multichannel pulse may be easily scaled up in a subsequent act. If, for example, the calculation takes place in the low flip range for a flip angle of maximum $\alpha=5°$, and the actual magnetization is to take place with a flip angle $\alpha$ of maximum 90°, the amplitude values of the HF pulses may be multiplied by a factor 18 according to the flip angle ratio. The resulting errors may be determined and corrected as part of a (Bloch) simulation.

A further tailoring of the HF local exposure value to the setpoint deviation in relation to the HF global exposure value may also take place in each of these subsequent method acts as permitted by the methods used in the respective act. The target function that may be used in one of the subsequent acts may also include a corresponding HF local exposure value of the examination object (e.g., a local exposure function term).

Further parameters relating to the tailoring of the HF local exposure value to the setpoint deviation in relation to the HF global exposure value may also be optimized in the context of the HF exposure optimization method. For example, the parameters used for HF pulse optimization within the Tikonov regularization or other system parameters within the context of optimization may be varied in order to achieve even better results.

To acquire raw data in an imaging sequence, not only may a multichannel pulse train be emitted, but the pulse trains may be repeated a number of times according to rules predefined in the control protocol (e.g., repetition time and frequency) in order to detect the data line by line in the received k space. In one embodiment, the multichannel pulse train is recalculated to emit repetition pulses. In other words, the pTX pulse is changed dynamically within an imaging sequence from line to line, while maintaining the target magnetization. The optimization method is performed again using identical input parameters for target magnetization but optionally modified parameters for an amplitude or phase variation (e.g., initial values, design parameters, VERSE parameters, regularization parameters, and/or weighting within the target functions) in order to obtain a different local minimum for the same target magnetization. All the acts of the method may not be performed again but just specific acts (e.g., a new optimization in the high flip range based on the identical results from the low flip optimization).

DETAILED DESCRIPTION OF THE DRAWINGS

Figure 1:
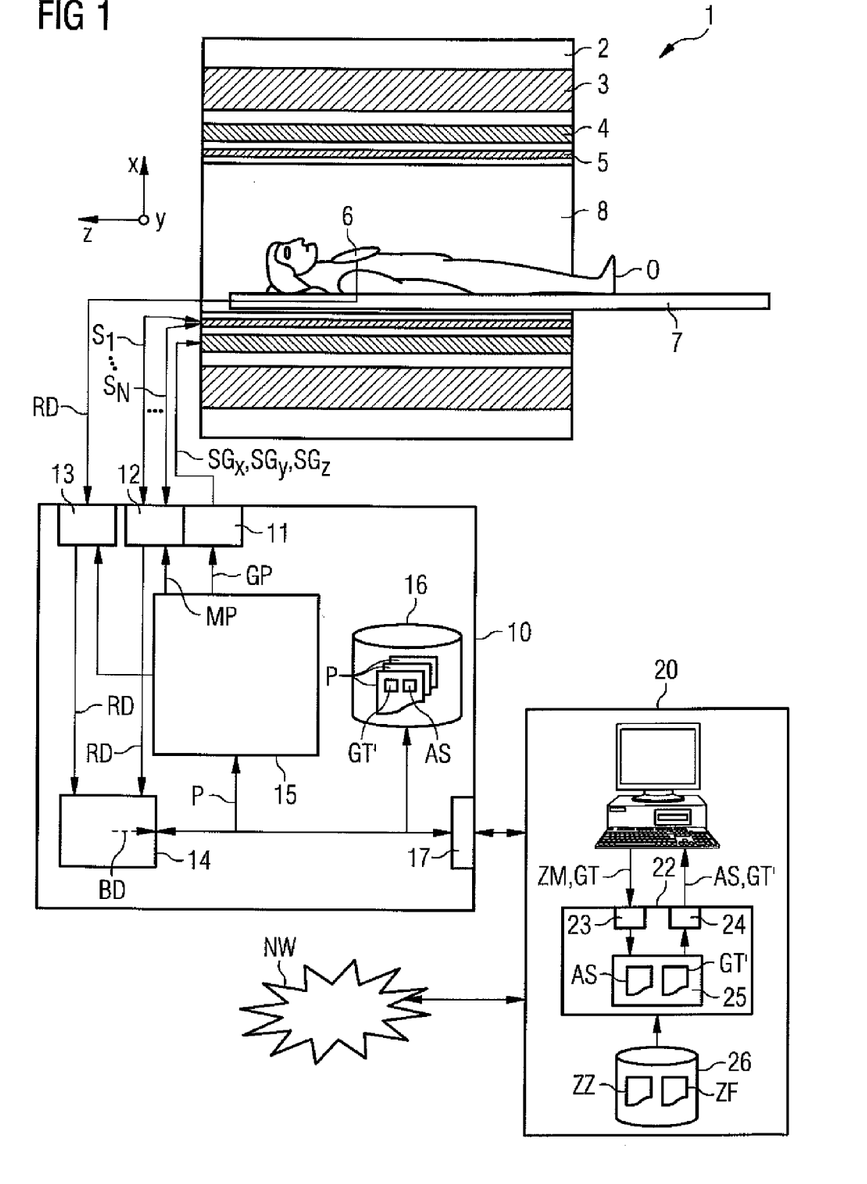
FIG. 1 shows a schematic diagram of one embodiment of a magnetic resonance system.

FIG. 1 shows a schematic diagram of one embodiment of a magnetic resonance system 1. The magnetic resonance system 1 includes a magnetic resonance scanner 2 and an examination space 8 or patient tunnel 8 located in the magnetic resonance scanner 2. A couch 7 (e.g., a patient bed) may be moved into the patient tunnel 8, so that a patient O (e.g., an examination object) or participant lying on the couch 7 may be supported during an examination in a certain position within the magnetic resonance scanner 2 relative to the magnet system and high-frequency system disposed in the magnetic resonance scanner 2 and may be moved between different positions during a measurement.

Components of the magnetic resonance scanner 2 are a basic field magnet 3, a gradient system 4 with magnetic field gradient coils to apply any magnetic field gradients in x, y and z directions, and a whole-body high-frequency coil 5 (e.g., a body coil). Magnetic resonance signals induced in the examination object O may be received by way of the body coil 5. The body coil may also be used to emit the high-frequency signals for inducing the magnetic resonance signals. In one embodiment, the magnetic resonance signals are received using local coils 6 that are disposed, for example, on or beneath the examination object O. All these components are known to the person skilled in the art and are therefore only shown in a roughly schematic manner in FIG. 1.

As shown in FIG. 1, the whole-body high-frequency coil 5 may be structured in the form of a birdcage antenna and features a number N of individual antenna rods that run parallel to the patient tunnel 8 and are disposed with even distribution around a periphery of the patient tunnel 8. Ends of the individual antenna rods are connected respectively in a capacitive manner in a ring.

The individual antenna rods may be controlled separately as individual transmit channels $S_1$-$S_N$ by a control device 10. The control device may be a control computer that may consist of a plurality of individual computers that may optionally also be separated spatially and connected together by way of suitable cables or a wireless connection. A terminal interface 17 connects the control device 10 to a terminal 20, using which an operator may activate the magnetic resonance system 1. In the embodiment shown in FIG. 1, the terminal 20 is configured as a computer with a keyboard, one or more screens and further input devices such as a mouse, for example, so that a graphical user interface is available to the operator.

The control device 10 features, among other things, a gradient control unit 11 that may consist of a number of subcomponents. The gradient control unit 11 is used to connect the individual magnetic field gradient coils to control signals $SG_x$, $SG_y$, $SG_z$. The control signals $SG_x$, $SG_y$, $SG_z$, are gradient pulses that are applied during a measurement at precisely specified temporal positions and with a precisely predefined temporal profile.

The control device 10 also includes a high-frequency (HF) transmit/receive unit 12. The HF transmit/receive unit 12 includes a plurality of subcomponents in order to be able to transmit high-frequency pulses in a separate and parallel manner to the individual transmit channels $S_1$-$S_N$ (e.g., to the individually activatable antenna rods of the body coil). The transmit/receive unit 12 may also be used to receive the magnetic resonance signals. In one embodiment, the local coils 6 may receive the magnetic resonance signals. Raw data RD received using the local coils 6 is read from an HF receive unit 13 and processed. The magnetic resonance signals received from the local coils 6 or from the body coil 5 using the HF transmit/receive unit 12 are transferred as the raw data RD to a reconstruction unit 14 that constructs the image data DB from the raw data RD and stores the image data DB in a memory 16 and/or transfers the image data DB by way of the interface 17 to the terminal 20, so that the operator may view the image data DB. The image data BD may also be stored and/or displayed in other places by way of a network NW and evaluated in one of the other places.

The gradient control unit 11, the HF transmit/receive unit 12 and the receive unit 13 for the local coils 6 are activated in a respectively coordinated manner by a measurement control unit 15. This provides that a desired gradient pulse train GP is emitted by suitable gradient control signals $SG_x$, $SG_y$, $SG_z$ and in a parallel manner activates the HF transmit/receive unit 12 so that a multichannel pulse train MP is emitted (e.g., the appropriate high-frequency pulses are passed to the individual transmit rods of the body coil 5 in a parallel manner on the individual transmit channels $S_1$-$S_N$). At the appropriate time point, the magnetic resonance signals at the local coils 6 are read by the HF receive unit 13, or any signals at the body coil 5 are read by the HF transmit/receive unit 12 and further processed. The measurement control unit 15 predefines the corresponding signals (e.g., the multichannel pulse train MP) to the high-frequency transmit/receive unit 12 and the gradient pulse train GP to the gradient control unit 11, according to a predefined control protocol P. Control data that is set during a measurement is stored in this control protocol P.

A plurality of control protocols P for different measurements may be stored in a memory 16. The plurality of control protocols P may be selected by the operator by way of the terminal 20, and the plurality of control protocols P may be varied in order to have an appropriate control protocol P for the current measurement, with which the measurement control unit 15 may operate. The operator may also call up the plurality of control protocols P by way of the network NW, for example, from a manufacturer of the magnetic resonance system 1 and modify and use some or all of the plurality of control protocols P as required.

The sequence of such a magnetic resonance measurement and the components for activation purposes discussed above are known to the person skilled in the art so the sequence and the components will not be discussed in detail further. The magnetic resonance scanner 2 and the associated control device 10 may also include a plurality of additional components, which are not examined in detail.

The magnetic resonance scanner 2 may also be of different structure, for example with a patient chamber open at a side. In one embodiment, the high-frequency body coil 5 is not in the form of the birdcage antenna. The high-frequency body coil 5 includes the plurality of separately activatable transmit channels $S_1$-$S_N$, and a corresponding number of channel controllers are correspondingly available in the control device 10 using the high-frequency transmit/receive device, in order to be able to activate the individual transmit channels $S_1$-$S_N$ separately.

FIG. 1 also shows a schematic diagram of one embodiment of a control sequence determination device 22 configured to determine a magnetic resonance system activation sequence AS. The magnetic resonance system activation sequence AS contains, among other things, a predefined multichannel pulse train MP for activating the individual transmit channels $S_1$-$S_N$ for a certain measurement. The magnetic resonance system activation sequence AS may be created as part of the measurement protocol P.

The control sequence determination device 22 is shown in FIG. 1 as part of the terminal or computer 20 and may be implemented in the form of software components on the computer of the terminal 21. The control sequence determination device 22 may be part of the control device 10 or may be implemented on a separate computation system, and the magnetic resonance system activation sequences AS are transferred by way of the network NW to the magnetic resonance system 1 (e.g., in the context of the control protocol P).

In one embodiment, the control sequence determination device 22 features an input interface 23. By way of the input interface 23, the control sequence determination device 22 obtains a target magnetization ZM that predefines an intended nature of a flip angle distribution during a desired measurement. A k space gradient trajectory GT is also predefined.

Defaults for the target magnetization ZM and the k space gradient trajectory GT are produced by an expert, who is trained to design control protocols for certain measurements. Resulting data is transferred to an HF pulse optimization unit 25 that automatically produces a certain activation sequence AS with an optimum multichannel pulse train MP to achieve a desired target magnetization ZM. In one embodiment of the method, the k space gradient trajectory GT (hereafter referred to as gradient trajectory) is also modified (e.g., a changed gradient trajectory GT' is produced). The changed gradient trajectory GT' is output by way of a control sequence output interface 24 and may be transferred to the control device 10, for example, as part of the control protocol P, in which further defaults are indicated for activating the magnetic resonance system 1 (e.g., parameters for reconstructing images from the raw data).

The sequence for a method for determining the magnetic resonance system activation sequence AS is described below with reference to the flow diagram according to FIG. 2, using an example.

In act I, the target magnetization ZM and a gradient trajectory GT are predefined. In other words, a gradient pulse sequence used to move the gradient trajectory GT off is defined.

In act II, the multichannel pulse train is designed automatically. The individual HF pulse sequences for the different transmit channels are designed. In other words, which HF pulse form is to be sent on which channel is precisely calculated. This is done for a "low flip range" with flip angles below 5°, as magnetization behavior is still linear in the low flip range. An iterative optimization method may be used, as the iterative optimization method has proven particularly suitable. A finite differences method may be used. Other optimization methods (e.g., optimization methods that are not iterative) may also be used.

The optimization method operates such that a least mean square deviation between the target magnetization and the actual magnetization is minimized. In other words, the following solution is sought:

$$b = \arg_b \min(\|m_{act} - m_{targ}\|^2) = \arg_b \min(\|A \cdot b - m_{targ}\|^2) \quad (1)$$

In equation (1), $m_{act} = A \cdot b$ is the actual magnetization, where A is a design matrix and b is a vector of the HF curves $b_c(t)$ to be emitted in a parallel manner. $m_{targ}$ is the target magnetization. Once the solution for equation (1) is found, the result is a function $b_c(t)$ of an amplitude as a function of time for the transmit channels present (e.g., N functions are obtained (one function $b_c(t)$ for each channel $c=1$ to N)).

The Tikonov regularization may be used as an extension of the target function, with which solutions for $b_c(t)$ that contain minimized HF amplitude values may be obtained, since the voltages are incorporated quadratically in the calculation of the output power. A target function extended by the Tikonov regularization according to equation (1) appears as follows:

$$b = \arg_b \min(\|A \cdot b - m_{targ}\|^2 + \beta^2 \|b\|^2) \quad (2)$$

The factor $\beta$ in equation (2) is what is a Tikonov parameter, the setting of which makes it possible to decide between the homogeneity of the flip angle and a large SAR.

According to the present embodiments, a target function ZF with a local exposure function term $f(SED_{loc}, SED_{glob})$ that is a function of an HF local exposure value $SED_{loc}$ and an HF global exposure value $SED_{glob}$ is predefined to provide that the HF local exposure value $SED_{loc}$ has a predefined setpoint deviation from the HF global exposure value $SED_{glob}$:

$$b = \arg_b \min(\|A \cdot b - m_{targ}\|^2 + \gamma f(SED_{loc}, SED_{glob})) \quad (3)$$

The value $\gamma$ in equation (3) is a weighting factor for finding an optimum (or a settable weighting) between an achievable homogeneity of the magnetization and a maximum deviation in relation to the predefined setpoint deviation between the HF local exposure value $SED_{loc}$ and the HF global exposure value $SED_{glob}$. $SED_{loc}$ is the local exposure vector of local SED values $SED_{loc,h}$ (in Ws/kg). The local SED values $SED_{loc,h}$ at a hot spot h in the body of the examination object O may be calculated using the following equation:

$$SED_{loc,h} = 0,5 \cdot \text{real}\left(\sum_{j=1}^{N}\sum_{k=1}^{N} ZZ_{hjk} - T_{sum,jk}\right) \cdot \frac{1}{\rho_h} \quad (4)$$

N is the number of independent transmit channels. $\rho_h$ is the density of the examination object O at hot spot h (in kg/m$^3$) and j and k are running variables, running from 1 to N. The values $ZZ_{hjk}$ are individual elements of a sensitivity matrix ZZ. In equation (4), the sensitivity matrix ZZ contains a sensitivity value for every hot spot h, which, when multiplied by the amplitude of the HF field, represents the E field in the relevant hot spot h and therefore forms a conversion factor from the amplitude of the high-frequency curve to the actual energy exposure in the hot spot h. In other words, if 30 hot spots h have been identified, the HF local exposure vector $SED_{loc}$ consists of 30 vector elements according to equation (4).

$T_{sum,jk}$ is a cross correlation of the HF curves of the HF pulse train:

$$T_{sum,jk} = \Delta t \cdot \sum_{c=0}^{N} conj(b'_c) \cdot b_c \quad (5)$$

In equation (5), $\Delta t$ is a sampling interval in s. The cross correlation indicates whether the HF curves of the HF pulse train increase or reduce with superimposition at a certain place.

The sensitivity matrix ZZ and the target function may be stored, for example, in a memory 26 of the control sequence determination device 22 and be retrieved from the control sequence determination device 22 as required. The sensitivity matrix ZZ may be determined beforehand, for example, using simulations using body models. One method for determining the sensitivity matrix ZZ and the local SED values $SED_{loc,h}$ is described, for example, in DE 10 2009 024 077, the content of which is fully incorporated. Different sensitivity matrices ZZ may be stored for different body types (e.g., patients of different sizes).

The local exposure function term $f(SED_{loc}, SED_{glob})$ in equation (3) may be configured in different ways. In one embodiment, the local exposure function term $f(SED_{loc}, SED_{glob})$ is selected with the aim of optimizing the ratio of the HF local exposure value to the HF global exposure value to a predefined value. A variant is the term:

$$f(SED_{loc}, SED_{glob}) = |\max_h(SED_{loc,h}) - \eta \cdot SED_{glob}| \quad (6)$$

Since the target function ZF according to equation (3) is minimized during optimization, the inclusion of the function terms according to equation (6) automatically provides that the difference between the $\eta$-times HF global exposure value $SED_{glob}$ and the maximum of the HF local exposure vector $SED_{loc}$ is minimized. In other words, the ratio of the HF local exposure value (e.g., the maximum of the HF local exposure vector $SED_{loc}$) to the HF global exposure value $SED_{glob}$ is optimized to a fixed value $\eta$. The factor $\eta$ may be predefined, for example.

As mentioned above, the HF global exposure value $SED_{glob}$ is defined in the usual manner. In other words, the HF global exposure value $SED_{glob}$ is a value, for which limit values already exist or which may be converted to a corresponding value in a simple manner. A conversion between a global SAR value and a global SED value may take place, for example, by way of sequence timing.

Figure 3:
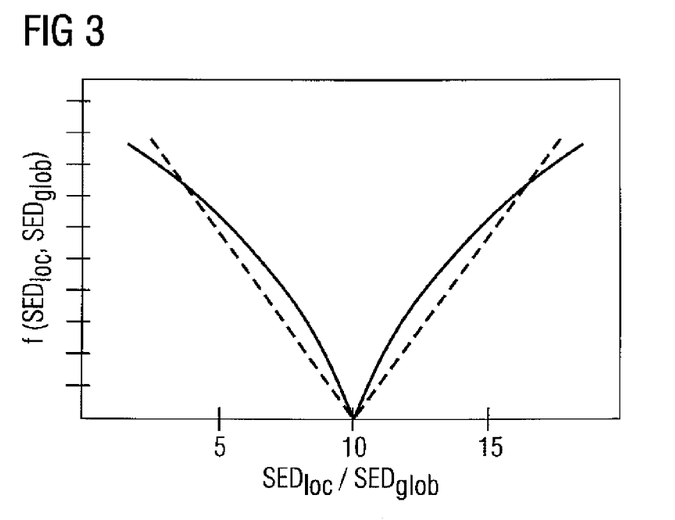
FIG. 3 shows graphs of two possible local exposure function terms.

FIG. 3 shows the graphs of two possible local exposure function terms. The two possible local exposure function terms show the function value $f(SED_{loc}, SED_{glob})$ (in arbitrary units) over the ratio of the two values $SED_{loc}/SED_{glob}$. Both function terms (e.g., $SED_{loc}$ and $SED_{glob}$) are selected so that a minimum is reached when the ratio $SED_{loc}/SED_{glob}$ is at a value 10, for example. A suitable value for the fixed ratio is a function of a very wide range of conditions, also including any predefined standard values. Such a function may also be defined, for example, by two subfunctions to the right and left of the fixed ratio or by the basic form defined in equation (6).

Figure 2:
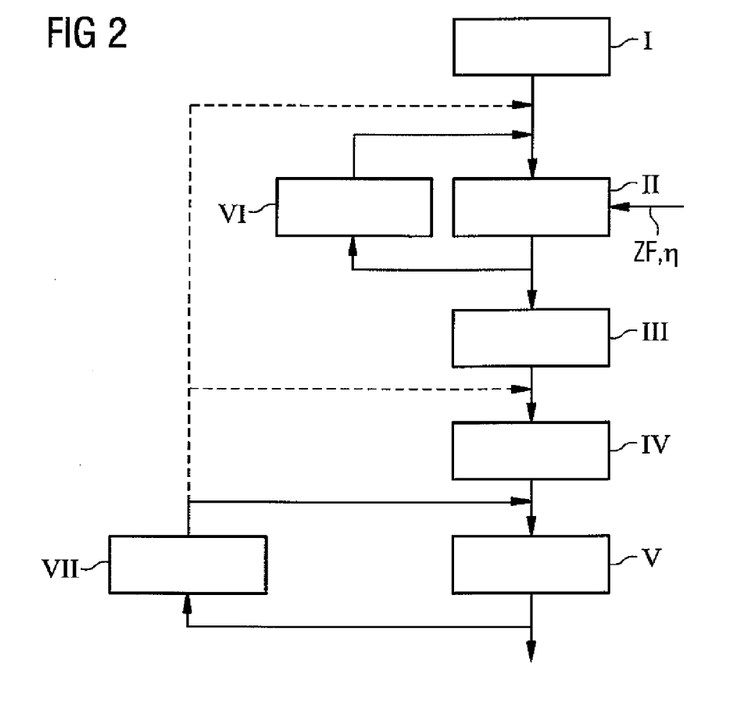
FIG. 2 shows a flow diagram of one embodiment of a method for determining a magnetic resonance system activation sequence.

FIG. 2 shows one embodiment of the method for determining the magnetic resonance system activation sequence AS shown by the method act VI connected in an iterative loop to the method act II. The gradient trajectory GT is predefined in act I in a form such that the geometry of the gradient trajectory GT may be changed (e.g., only an initial basic geometry is predefined). As an example, it is assumed below that the initially predefined gradient trajectory GT is a spiral in the k space in an x/y plane (e.g., an extended spiral). The extended spiral is defined by the following function:

$$k = r(t, n_1, n_2) \cdot e^{(-2\pi i t n_0)} \quad (7)$$

In equation (7), $r(t, n_1, n_2)$ is the radius of the spiral at time t, and $n_0$ is the number of points on the spiral. The two variables $n_1$ and $n_2$ are the parameters that may be varied in the context of the optimization method, in order to also be able to optimize the gradient trajectory with respect to minimization of the HF exposure for the patient. In the case of the initial geometry, the variables $n_1$ and $n_2$ may both be set, for example, at 0.33. In other words, the radius r increases in a linear manner so that there is an Archimedean spiral.

Within an iterative method, not only the HF pulses but also the geometric parameters of the gradient trajectory are changed in act VI. The HF pulses and the geometric parameters are part of the actual magnetization $m_{act}$ in the target function. For each iteration loop, the HF pulse train $b_c(t)$ is recalculated as described above. The additional iterative tailoring of the gradient parameter provides that not only is the target function minimized and therefore the optimum HF pulse sequences found, but the effective high-frequency output is also adjusted at the same time by selecting the appropriate gradient trajectory in the k space, in order to achieve the optimization target.

As part of the iteration, the geometry of the gradient trajectory in the k space changes. The gradient trajectory still has, for example, the basic form of a spiral. The geometric parameters of the spiral, now, have different values (e.g., $n_1 = 0.097$ and $n_2 = 0.302$). The spiral covers roughly the same region as before optimization, so that the image quality has not changed essentially, but the HF energy is deposited at different points. One geometric parameter has been varied automatically to a significant degree during optimization, while another geometric parameter has remained almost the same. According to the present embodiments, the local HF exposure may be reduced by optimizing the gradient trajectory, but the local HF exposure may also be increased if the HF exposure limit has not yet been reached, in order to be able to closely tailor the HF local exposure value $SED_{loc}$ to the setpoint deviation in relation to the global exposure value $SED_{glob}$.

The desired tailoring of the HF local exposure value $SED_{loc}$ to the setpoint deviation in relation to the global exposure value $SED_{glob}$ may be assisted by optimizing further parameters of relevance within the target function according to the optimization target. As already mentioned above in relation to equation (3), the Tikonov regularization may be included in the target function. HF pulses with low voltages or amplitudes may take place in this manner. In the context of the optimization, the optimum regularization factor may be determined automatically so that the desired ratio is achieved between the HF global exposure value $SED_{glob}$ and the HF local exposure value $SED_{loc}$. The sampling speed of the k space trajectories may also be parameterized and/or the HF pulses may be extended or compressed by reducing or increasing the maximum permitted gradient rate and slew rate.

After the performance of act II, a multichannel pulse sequence $MP_L$ obtained for the low flip range and an optimized gradient trajectory GT' are available at the end of the optimization method. The multichannel pulse sequence $MP_L$ is scaled up in act III to achieve the actually desired target magnetization, which may not be in a flip angle range of 5°, but goes up to a 90° flip angle or more. This is done by multiplying the amplitudes of the individual pulses by the desired scaling factor.

In act IV, the error that may occur during scaling up is corrected by a Bloch simulation. The correction may also be done with a partial Bloch simulation that is performed at individual time points within the pulse sequence and not at other times. In this process, the Bloch equations are used to test the data for the respective HF time point, for which tailoring is to take place, in a simulator applying the Bloch equations, and the magnetization achieved is thus calculated. Improvements relating to the predefined target magnetization may be revealed, and corresponding smaller corrections may be made by changing the high-frequency pulse sequences. An iteration, as in act II, also takes place during the simulation, but now with a precise calculation of the Bloch equations with the values from act III being used as initial values. The calculations from act VI may also be performed again (e.g., using derivations of the target function that may be calculated analytically (e.g., Jacobi matrices or Hesse matrices)).

In act V, there is a final tailoring of the HF exposure. The VERSE algorithm for multidimensional gradient and HF trajectories, as discussed above, may be used for this purpose. An optimizer may be used to limit the local HF exposure and local rising of the local HF exposure in order to be able to tailor the HF local exposure value $SED_{loc}$ to the setpoint deviation in relation to the global exposure value $SED_{glob}$ in an optimum manner.

In both act IV and act V, the target functions used may feature a local exposure function term as in act II. In other words, the same target function as in act II may be used.

In act VII, the pTX pulse may optionally be changed dynamically from line to line during a pulse repetition within an imaging sequence while maintaining target magnetization. In this process, parameters for amplitude or phase variation used in acts II, III, IV, V, and VI (e.g., initial values, design parameters, VERSE parameters, regularization parameters, a weighting within the target functions) may be changed. The result is a slightly modified activation sequence with the same target magnetization but differently weighted hot spots. The spatially improved distribution of the hot spots between the repetition pTX pulses reduces local HF exposure as a temporal mean. This method may be used when an overall reduction of the HF local exposure value $SED_{loc}$ is to be provided to tailor the HF local exposure value $SED_{loc}$ to the setpoint deviation in relation to the global exposure value $SED_{glob}$. To save computation time, the repetition pTX pulse may not be completely recalculated from the start (e.g., from act II of the method) as one backward jump is performed, for example, between acts IV and V or between acts II and IV, and a new repetition pTX pulse is calculated with the input values. Such a method is described, for example, in DE 10 2009 020 398, the content of which is fully incorporated.

The detailed method and structures described above are exemplary embodiments, and the basic principle may be varied extensively by the person skilled in the art without departing from the scope of the invention. During optimization, the HF global exposure value $SED_{glob}$ (and therefore also the HF local exposure value $SED_{loc}$) is minimized to reduce the HF exposure overall as is desired with respect to image quality.

The use of the indefinite article "a" does not preclude the relevant features also being present in greater numbers.

Similarly, the term "unit" does not preclude the unit from consisting of a number of components that may optionally be distributed spatially.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A method for determining a magnetic resonance system activation sequence, the magnetic resonance system activation sequence comprising a multichannel pulse train having a plurality of individual HF pulse trains emitted in a parallel manner by the magnetic resonance system by way of different independent high-frequency transmit channels, the method comprising:
calculating, with a control sequence determination device, the multichannel pulse train based on a predefined target magnetization using an HF pulse optimization, calculating the multichannel pulse train using the HF pulse optimization comprising optimizing a setpoint deviation of an HF local exposure value from an HF global exposure value, optimizing the setpoint deviation comprising optimizing a ratio of the HF local exposure value to the HF global exposure value to a predefined value; and
changing, subsequent to optimizing the setpoint deviation, parameters relating to HF exposure such that the HF local exposure value is increased when the HF local exposure value is below a predefined setpoint value.

2. The method as claimed in claim 1, wherein the HF local exposure value is based on a combination of different local HF exposure values in different volume units.

3. The method as claimed in claim 1, wherein a local HF exposure value is based on a correlation of the plurality of individual HF pulse trains of the multichannel pulse train, a sensitivity matrix, or the correlation of the plurality of individual HF pulse trains of the multichannel pulse train and the sensitivity matrix, the sensitivity matrix representing the dependency of an HF exposure on a current HF transmit amplitude in a respective volume unit for different volume units of an examination object.

4. The method as claimed in claim 2, wherein the HF local exposure value comprises a predefined standard of an HF local exposure vector.

5. The method as claimed in claim 1, further comprising a plurality of method stages, with the HF local exposure value being optimized with respect to the setpoint deviation from the HF global exposure value using different methods in different method stages of the plurality of method stages.

6. The method as claimed in claim 1, wherein a target function used within the HF pulse optimization is predefined such that the target function comprises at least one HF local exposure value of an examination object, the at least one HF local exposure value being a function of the magnetic resonance system activation sequence.

7. The method as claimed in claim 6, wherein the target function is a function of a deviation of the HF local exposure value from the HF global exposure value.

8. The method as claimed in claim 1, wherein calculating the multichannel pulse train comprises calculating the multichannel pulse train on the basis of a predefined k space gradient trajectory, the predefined k space gradient trajectory being optimized in an HF exposure optimization using a parameterizable function with respect to the HF local exposure value.

9. The method as claimed in claim 8, wherein a sampling speed of the predefined k space gradient trajectory is set during the emission of HF pulses such that the sampling speed is reduced at points where an expected HF voltage is higher than a predefined HF voltage and increased at points where the expected HF voltage is lower than the predefined HF voltage.

10. The method as claimed in claim 1, wherein an HF pulse form is varied so that HF pulses are extended over time at points where an expected local HF exposure value is higher than a predetermined local HF exposure value and compressed over time at points where the expected local HF exposure value is lower than the predetermined local HF exposure value.

11. The method as claimed in claim 1, further comprising recalculating the multichannel pulse train to emit repetition pulses.

12. A method for operating a magnetic resonance system, the magnetic resonance system having a plurality of independent high-frequency transmit channels, the method comprising:
determining an activation sequence, the activation sequence comprising a multichannel pulse train having a plurality of individual HF pulse trains emitted in a parallel manner by the magnetic resonance system by way of different independent high-frequency transmit channels,
wherein the determining comprises:
calculating the multichannel pulse train based on a predefined target magnetization using an HF pulse optimization, calculating the multichannel pulse train using the HF pulse optimization comprising optimizing a setpoint deviation of an HF local exposure value from an HF global exposure value, optimizing the setpoint deviation comprising optimizing a ratio of the HF local exposure value to the HF global exposure value to a predefined value; and
changing, subsequent to optimizing the setpoint deviation, parameters relating to HF exposure such that the HF local exposure value is increased when the HF local exposure value is below a predefined setpoint value; and
operating the magnetic resonance system using the activation sequence.

13. A control sequence determination device for determining a magnetic resonance system activation sequence, the magnetic resonance system activation sequence comprising a multichannel pulse train with a plurality of individual HF pulse trains to be emitted in a parallel manner by the magnetic resonance system by way of different independent high-frequency transmit channels, the control sequence determination device comprising:
an input interface configured to detect a target magnetization;
an HF pulse optimization unit configured to calculate the multichannel pulse train on the basis of a predefined target magnetization in an HF pulse optimization; and
a control sequence output interface,
wherein the HF pulse optimization unit is configured to perform an optimization with respect to a setpoint deviation of an HF local exposure value from an HF global exposure value in the HF pulse optimization, and wherein the HF pulse optimization unit is further configured to change, subsequent to the optimization of the setpoint deviation, parameters relating to HF exposure such that the HF local exposure value is increased when the HF local exposure value is below a predefined setpoint value.

14. A magnetic resonance system comprising:
a plurality of independent high-frequency transmit channels;
a gradient system;
a control device configured to emit a multichannel pulse train with a plurality of parallel individual HF pulse trains by way of the plurality of independent high-frequency transmit channels to perform a desired measurement based on a predefined activation sequence;
a control sequence determination device configured to determine the predefined activation sequence and transfer the predefined activation sequence to the control device, the control sequence determination device comprising:
 an input interface configured to detect a target magnetization; and
 an HF pulse optimization unit configured to calculate the multichannel pulse train on the basis of a predefined target magnetization in an HF pulse optimization; and
a control sequence output interface,
wherein the HF pulse optimization unit is configured to perform an optimization with respect to a setpoint deviation of an HF local exposure value from an HF global exposure value in the HF pulse optimization, and
wherein the HF pulse optimization unit is further configured to change, subsequent to the optimization of the setpoint deviation, parameters relating to HF exposure such that the HF local exposure value is increased when the HF local exposure value is below a predefined setpoint value.

15. A non-transitory computer readable medium comprising computer readable instructions that, when executed by a control sequence determination device, cause the control sequence determination device determine a magnetic resonance system activation sequence, the magnetic resonance system activation sequence comprising a multichannel pulse train having a plurality of individual HF pulse trains emitted in a parallel manner by the magnetic resonance system by way of different independent high-frequency transmit channels, the computer readable instructions comprising:
 calculating the multichannel pulse train based on a predefined target magnetization using an HF pulse optimization,
 wherein a setpoint deviation of an HF local exposure value from an HF global exposure value is optimized in the HF pulse optimization, parameters relating to HF exposure being changeable such that, subsequent to the optimization of the setpoint deviation, the HF local exposure value is increased when the HF local exposure value is below a predefined setpoint value.

16. The method as claimed in claim 3, wherein the HF local exposure value comprises a predefined standard of an HF local exposure vector.

17. The method as claimed in claim 2, wherein a target function used within the HF pulse optimization is predefined such that the target function comprises at least one HF local exposure value of an examination object, the at least one HF local exposure value being a function of the magnetic resonance system activation sequence.

18. The method of claim 1, wherein optimizing the setpoint deviation of the HF local exposure value from the HF global exposure value comprises optimizing a setpoint deviation of a maximum HF local exposure value from the HF global exposure value.

19. The method of claim 1, wherein calculating the multichannel pulse train using the HF pulse optimization comprises weighting importance of the setpoint deviation of the HF local exposure value from the HF global exposure value relative to homogeneity of magnetization.

20. The method of claim 19, wherein the weighting comprises identifying a predefined weighting factor applied to the setpoint deviation of the HF local exposure value from the HF global exposure value.

21. The method of claim 19, wherein the weighting comprises optimizing a weighting factor applied to the setpoint deviation of the HF local exposure value from the HF global exposure value.

* * * * *